NEGATIVE RESISTANCE SEMICONDUCTOR DEVICE
HAVING AN INTRINSIC REGION
Filed Aug. 1, 1966

3,461,356
NEGATIVE RESISTANCE SEMICONDUCTOR DEVICE HAVING AN INTRINSIC REGION

Akio Yamashita, Ikeda-shi, and Masaru Tanaka, Toyonaka-shi, Japan, assignors to Matsushita Electric Industrial Co., Ltd., Osaka, Japan, a corporation of Japan Filed Aug. 1, 1966, Ser. No. 569,300
Claims priority, application Japan, Aug. 19, 1965, 40/51,141, 40/51,242; Aug. 27, 1965, 40/52,897
Int. Cl. H01l 3/00
U.S. Cl. 317—234 7 Claims

ABSTRACT OF THE DISCLOSURE

A semiconductor device comprising an i-type semiconductor body doped with a deep-level-forming impurity in such a manner that the distribution of the impurity in the i-type body is not uniform but has a concentration gradient, two metal electrodes, and, as the case may be, alloyed regions between the electrodes and the i-type body. The device has a negative resistance characteristic, and the ratio of the turnover voltage to holding voltage and the switching time are improved. When one of the electrodes form a Schottky barrier with the i-type body, the current-voltage characteristic is unsymmetrical.

The present invention relates to semiconductor devices, and more particularly to semiconductor devices having negative resistance characteristics useful for switching elements.

Recently, attention is beginning to be paid to a double injection diode, which is a semiconductor device having negative resistance. This double injection diode has the structure of p-i-n. The i region is a region which is doped with an impurity forming a deep level or levels within the forbidden band of a semiconductor substrate. The p and n regions are well known regions in which holes and electrons are majority carriers, respectively.

When a voltage is applied to such a diode in the forward direction, electrons and holes are concurrently injected into the i region. If the injection level of the electrons and holes is low, however, a current barely flows due to the recombination of the electrons and the holes caused by the fact that the deep level impurity existing in the i region acts as recombination centers. If the injection level becomes higher, the electrons and holes drift through the i region without recombining and contribute to the current. As a result, a high resistance of the i region changes to a low resistance to realize a negative resistance.

In this diode, the distribution of the deep-level impurity in the i region is uniform. A diode of this structure, however, does not provide a negative resistance suitable enough for switching elements, i.e. its switching time is relatively long (of the order of $10^{-6}$ sec.) and the ratio of its turnover voltage to holding voltage is small.

It is an object of this invention to provide a semiconductor device characterized in that the distribution of the deep-level impurity in the i region is not uniform; that there is formed in the semiconductor body at least one region having a concentration gradient of the deep-level impurity, and that said semiconductor body is provided with at least two electric connections, at least one of which is formed in a region wih a higher concentration of deep-level impurity.

According to the present invention, there is provided a semiconductor device having a switching time of the order of $10^{-12}$ sec. in which the ratio of its turnover to holding voltages is large. In contrast to conventional p-i-n diodes, a semiconductor device according to this invention has another striking feature in that the leakage current in a cut-off state is quite small.

Other objects, features and advantages of the present invention will become more apparent from the following detailed description of the invention when taken in conjunction with the accompanying drawings, in which.

Figure 1:
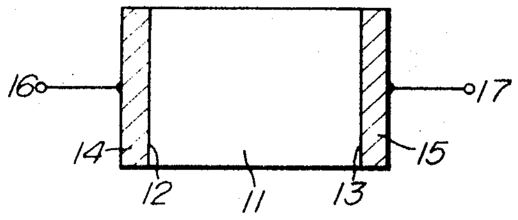
FIG. 1 is a schematic diagram of a device of the simplest structure fabricated according to the present invention.

The operation mechanism of semiconductor devices according to the invention will first be described hereinbelow with reference to FIG. 1. A reference numeral 11 designates an i region doped with a deep-level impurity. The concentration of the impurity is not uniform, but decreases as the distance from a junction surface 12, for example, increases towards a junction surface 13. Reference numerals 14 and 15 designate metal electrodes joined to the body of the semiconductor, and 16 and 17 designate terminals connected to said electrodes 14 and 15, respectively.

Figure 2:
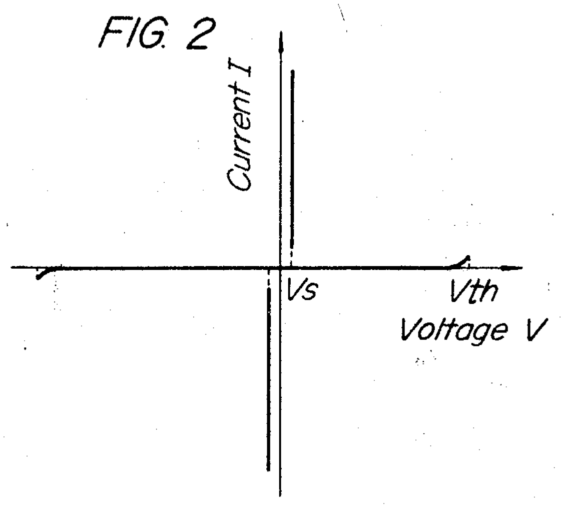
FIG. 2 is a voltage vs. current characteristic of a device according to the invention.

When a D.C. voltage is applied across the terminals 16 and 17, an electric field is induced in the i region 11. Since the resistivity of the area near the junction surface 12 is higher, the induced field in that area is correspondingly stronger. At some critical voltage, the atoms are ionized by collision of electrons to increase the number of electrons and holes, and accordingly the resistance of the region 11 decreases. The electrons ionizing the atoms are injected from the electrode 14 when a negative voltage is present at the terminal 16. Conversely, when the terminal 16 is a positive terminal, the said electrons either come from the right hand side of the region 11 or are produced thermally in the area having a high resistivity. As a result of the increase in the number of electrons and holes, a sharp negative resistance with a large variation in electric resistance as shown in FIG. 2 is obtained. It is to be noted that if such metal electrodes form, when brought into contact with a part of the semiconducor body having a high resistivity, a Schottky barrier, the turnover voltage Vth becomes higher. In this case, since the resistivity of the area near the junction 12 in the region 11 is very high while that of the area near the junction 13 is in the region 11 is low, a Schottky barrier is formed at the junction 12, whereas such a barrier is hardly produced at the junction 13. Therefore, the electrical characteristics of the device are not symmetrical.

The metal electrodes can be replaced by n-type or p-type conductive layers. It is also possible to make the concentration of the deep-level impurity at the area near the junction surface 13 in the i region 11 higher. Such modifications as mentioned above naturally no not change the principle of the invention.

Now, examples of the device according to the invention will be described hereinbelow.

(1) Au was diffused as a deep-level impurity from one side into an n-type Ge body having a resistivity of 10 Ω=cm. In this process, the concentration distribution of the impurity, characteristic of the present invenion, can be formed in the body by suitably controlling the supply quantity of the impurity, the diffusion temperature and diffusion time. Even if Au is diffused from one side of the body, a region having a high concentration of Au is formed at the other side of the semiconductor, since Au tends to segregate on the surface in the cooling step after the diffusion. Then the region in which the concentration of Au is higher than around it due to the segregation is removed by polishing. Then Mo metal was spattered on the Ge body to form electrodes. A current (I) vs. voltage (V) characteristic of the diode thus obtained is shown in FIG. 2. It is seen from this figure that a negative resistance appears both in forward and reverse directions. The turnover voltage Vth, however, is higher in one direction. This is because the Schottky barrier at the junction between the electrode 14 and the Ge body makes the injection of electrons more difficult in one direction.

Figure 3:
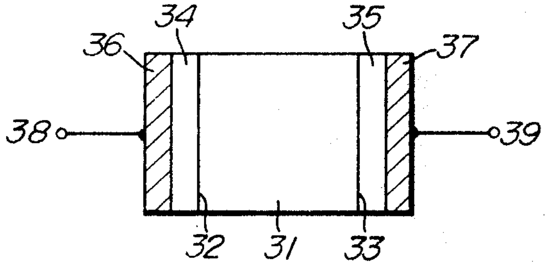
FIG. 3 is a schematic view of an embodiment of the invention.

(2) Cu was diffused thermally as a deep-level-forming impurity into Si having a resistivity of 100 Ω-cm. from both sides. Also in this case, it is possible to form a region having a high concentration of Cu at the surface by suitably controlling the diffusion temperature and diffusion time. An n-type layer was then formed near the surface by alloying Au (0.8% Sb) with Si in which Sb is an n-type forming impurity. FIG. 3 shows a diode fabricated in this way. Reference numeral 31 indicates the i region doped with Cu in which the concentration of the deep-level Cu decreases with inward distance of the region 31 from the junction surface 32 or 33. 34 and 35 designate n-type conductive layers, 36 and 37 metal electrodes of Au (0.8% Sb), and 38 and 39 indicate terminals connected to the metal electrodes. The V-I characteristic obtained in this device showed a sharp negative resistance of the current controlled type which was symmetrical in both directions. The turnover voltage was also 40–50 times higher than that of conventional p-i-n diodes.

(3) Si having a resistivity of 100 Ω-cm. was used to form a device whose structure was the same as that of the device described in Example (2). With this device it is possible to change the turnover voltage in the negative resistance characteristic by connecting, as a third electrode, an Al metal electrode to the part of the i region 31 having a low concenration of deep-level Cu. It is conjectured that this effect results from the fact that a number of carriers are fed into the i region by the third gate electrode.

It is apparent that, in addition to Ge and Si referred to above, compound semiconductors such as GaAs and GaP can also be employed as the semiconductor body without thereby changing the effect of the invention. Also, Fe, Co, Ni, Zn, Mn or the like can generally be used besides Cu and Au as the deep-level-forming impurity. In this case, however, said level varies with the kind of the semiconductor body to be doped with the impurity. Also, most of these deep-level impurities work as acceptors and thus the i region doped with one of these impurities has p-type conductivity. By joining an n-type layer to the p-type region, the ratio of the turnover voltage to holding voltage is made appreciably larger and the device is made more appropriate for switching elements.

The semiconductor devices of the present invention can be used for switching elements, switching elements for automatic control and the like, and have a wide range of application.

What is claimed is:

1. A semiconductor device comprising a semiconductor body of intrinsic material including first and second regions doped with a deep level impurity, and at least two two electrodes attached to the semiconductor body, said deep-level impurity being distributed in such a manner as to produce a gradient of impurity concentration in said first region higher than the impurity concentration in said second region, and at least one of said electrodes being adjacent to said first region.

2. A semiconductor device according to claim 1, in which the other of said electrodes is provided adjacent the second region.

3. A semiconductor device according to claim 1, wherein the material of said electrodes is one which, when brought into contact with the first region forms a Schottky barrier therebetween.

4. A semiconductor device according to claim 1, further comprising an n-type region disposed between said intrinsic region and at least one of said at least two electrodes.

5. A semiconductor device according to claim 1, further comprising a n-type region disposed between said intrinsic region and at least one of said at least two electrodes.

6. A semiconductor device according to claim 2, further comprising an n-type region disposed between said intrinsic region and at least one of said at least two electrodes.

7. A semiconductor device according to claim 2, further comprising a p-type region disposed between said intrinsic region and at least one of said at least two electrodes.

References Cited

UNITED STATES PATENTS

| | | | |
|---|---|---|---|
| 2,908,871 | 10/1959 | McKay | 317—235 |
| 3,008,089 | 11/1961 | Uhlir | 317—235 |
| 3,270,258 | 8/1966 | Gault | 317—235 |
| 3,366,793 | 1/1968 | Svedberg | 317—235 |
| 3,370,209 | 2/1968 | Davis et al. | 317—235 |
| 3,374,176 | 3/1968 | Potter | 317—235 |
| 3,378,414 | 4/1968 | Freck et al. | 317—235 |

JOHN W. HUCKERT, Primary Examiner

ANDREW J. JAMES, Assistant Examiner

U.S. Cl X.R.

317—235

PO-1050
(5/69)

UNITED STATES PATENT OFFICE
CERTIFICATE OF CORRECTION

Patent No. 3,461,356 Dated August 12, 1969

Inventor(s) AKIO YAMASHITA and MASARU TANAKA

It is certified that error appears in the above-identified patent and that said Letters Patent are hereby corrected as shown below:

In the priority claim, the second Japanese application "40/51,242" should read --40/51,142--.

SIGNED AND
SEALED
JUL 21 1970

(SEAL)
Attest:

Edward M. Fletcher, Jr.
Attesting Officer

WILLIAM E. SCHUYLER, JR.
Commissioner of Patents